US008823176B2

(12) United States Patent  (10) Patent No.: US 8,823,176 B2
Yang et al.  (45) Date of Patent: Sep. 2, 2014

(54) DISCONTINUOUS/NON-UNIFORM METAL CAP STRUCTURE AND PROCESS FOR INTERCONNECT INTEGRATION

(75) Inventors: Chih-Chao Yang, Glenmont, NY (US); Lynne M. Gignac, Beacon, NY (US); Chao-Kun Hu, Somers, NY (US); Surbhi Mittal, West Orange, NJ (US)

(73) Assignee: International Business Machines Corporation, Armonk, NY (US)

( * ) Notice: Subject to any disclaimer, the term of this patent is extended or adjusted under 35 U.S.C. 154(b) by 441 days.

(21) Appl. No.: 12/247,632

(22) Filed: Oct. 8, 2008

(65) Prior Publication Data

US 2010/0084767 A1  Apr. 8, 2010

(51) Int. Cl.
*H01L 29/40* (2006.01)
*H01L 23/532* (2006.01)
*H01L 21/768* (2006.01)
*H01L 21/02* (2006.01)

(52) U.S. Cl.
CPC .... *H01L 23/53252* (2013.01); *H01L 21/76865* (2013.01); *H01L 21/76849* (2013.01); *H01L 21/02362* (2013.01)
USPC ......................................................... 257/769

(58) Field of Classification Search
CPC ................................................ H01L 21/02362
See application file for complete search history.

(56) References Cited

U.S. PATENT DOCUMENTS

| | | | |
|---|---|---|---|
| 5,585,673 A | 12/1996 | Joshi et al. | |
| 5,695,810 A | 12/1997 | Dubin et al. | |
| 6,147,009 A * | 11/2000 | Grill et al. | 438/780 |
| 6,323,554 B1 | 11/2001 | Joshi et al. | |
| 6,342,733 B1 | 1/2002 | Hu et al. | |
| 6,706,625 B1 | 3/2004 | Sudijono et al. | |
| 6,821,909 B2 | 11/2004 | Ramanathan et al. | |
| 6,955,984 B2 * | 10/2005 | Wan et al. | 438/678 |
| 7,074,719 B2 | 7/2006 | Kim et al. | |
| 7,190,079 B2 | 3/2007 | Andricacos et al. | |
| 7,313,308 B2 | 12/2007 | Turner et al. | |
| 7,404,985 B2 | 7/2008 | Chang et al. | |
| 7,737,528 B2 * | 6/2010 | Bonilla et al. | 257/529 |
| 7,776,740 B2 * | 8/2010 | Suzuki et al. | 438/674 |
| 2003/0075808 A1 * | 4/2003 | Inoue et al. | 257/774 |
| 2004/0084773 A1 * | 5/2004 | Johnston et al. | 257/751 |

(Continued)

FOREIGN PATENT DOCUMENTS

WO  WO2006038954 A1  4/2006

OTHER PUBLICATIONS

Supplemental European Search Report dated Apr. 16, 2012 received in a corresponding foreign application.

(Continued)

*Primary Examiner* — Benjamin Sandvik
(74) *Attorney, Agent, or Firm* — Scully, Scott, Murphy & Presser, P.C.; Louis J. Percello, Esq.

(57) ABSTRACT

An interconnect structure including a noble metal-containing cap that is present at least on some portion of an upper surface of at least one conductive material that is embedded within an interconnect dielectric material is provided. In one embodiment, the noble metal-containing cap is discontinuous, e.g., exists as nuclei or islands on the surface of the at least one conductive material. In another embodiment, the noble metal-containing cap has a non-uniform thickness across the surface of the at least one conductive material.

19 Claims, 5 Drawing Sheets

(56) References Cited

U.S. PATENT DOCUMENTS

| | | |
|---|---|---|
| 2004/0087141 A1* | 5/2004 | Ramanathan et al. ........ 438/678 |
| 2004/0113279 A1 | 6/2004 | Chen et al. |
| 2004/0224500 A1* | 11/2004 | Cho ............................. 438/643 |
| 2004/0262772 A1* | 12/2004 | Ramanathan et al. ........ 257/777 |
| 2006/0121733 A1 | 6/2006 | Kilpela et al. |
| 2006/0131751 A1* | 6/2006 | Minamihaba et al. ........ 257/758 |
| 2006/0205204 A1 | 9/2006 | Beck |
| 2007/0018332 A1 | 1/2007 | Ueno |
| 2007/0082474 A1 | 4/2007 | Shih et al. |
| 2007/0224801 A1 | 9/2007 | Yang et al. |
| 2008/0054466 A1* | 3/2008 | Nasu et al. .................... 257/751 |
| 2008/0197499 A1 | 8/2008 | Yang et al. |
| 2008/0211097 A1* | 9/2008 | Kawahara et al. ............ 257/751 |
| 2008/0224314 A1 | 9/2008 | Sparks |

OTHER PUBLICATIONS

Letter from IBM China which indicates that the date of the issued Office Action is Jan. 29, 2013.

United States Official Action dated Apr. 18, 2014 from related U.S. Appl. No. 13/600,773.

* cited by examiner

DISCONTINUOUS/NON-UNIFORM METAL CAP STRUCTURE AND PROCESS FOR INTERCONNECT INTEGRATION

FIELD OF THE INVENTION

The present invention relates to semiconductor interconnect structures, and a method of fabricating the same. More particularly, the present invention relates to semiconductor interconnect structures having enhanced electromigration (EM) resistance without degrading time dependent dielectric breakdown reliability.

BACKGROUND OF THE INVENTION

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

In semiconductor interconnect structures, electromigration (EM) has been identified as one metal failure mechanism. Electromigration is the transport of material caused by the gradual movement of the ions in a conductor due to the momentum transfer between conducting electrons and diffusing metal atoms. The effect is important in applications where high direct current densities are used, such as in microelectronics and related structures. As the structure size decreases, the practical significance of EM increases.

EM is one of the worst reliability concerns for very large scale integrated (VLSI) circuits and manufacturing since the 1960's. The problem not only needs to be overcome during the process development period in order to qualify the process, but it also persists through the lifetime of the chip. Voids are created inside the metal conductors of an interconnect structure due to metal ion movement caused by the high density of current flow.

Although the fast diffusion path in metal interconnects varies depending on the overall integration scheme and materials used for chip fabrication, it has been observed that metal atoms, such as Cu atoms, transported along the metal/post planarized dielectric cap interface play an important role on the EM lifetime projection. The EM initial voids first nucleate at the metal/dielectric cap interface and then grow in the direction to the bottom of the interconnect, which eventually results in a circuit dead opening.

Figure 1A:
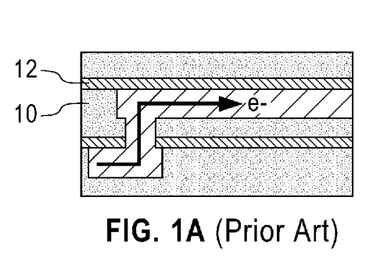
FIGS. 1A-1D are pictorial representations (through cross sectional views) illustrating the formation of a circuit dead opening in a prior art interconnect structure which is caused by EM failure.
Figure 1B:
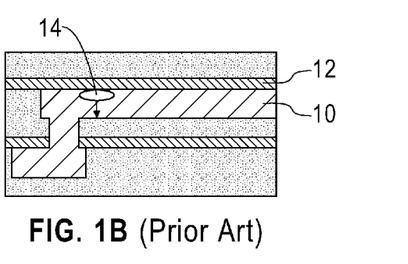
Figure 1C:
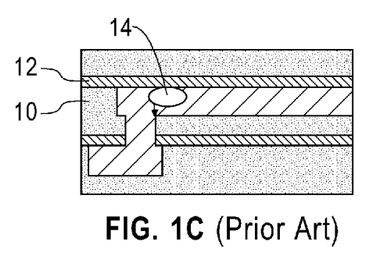
Figure 1D:
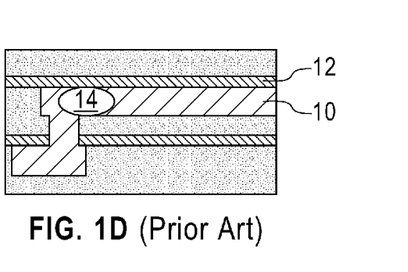

FIGS. 1A-1D are pictorial representations of a prior art interconnect structure at various stages of an EM failure. In these drawings, reference numeral 12 denotes the dielectric cap, and reference numeral 10 denotes the metal interconnect feature; all other components of the prior art interconnect structure are not labeled to avoid obscuring the EM problem. FIG. 1A is at an initial stress stage. FIG. 1B is at a time when void 14 nucleation initiates at the metal interconnect feature 10/dielectric cap 12 interface. FIG. 1C is at a time when the void 14 grows towards the bottom of the conductive feature 10, and FIG. 1D is at a time in which the void 14 growth crosses the metal interconnect feature 10 causing a circuit dead opening.

Figure 2:
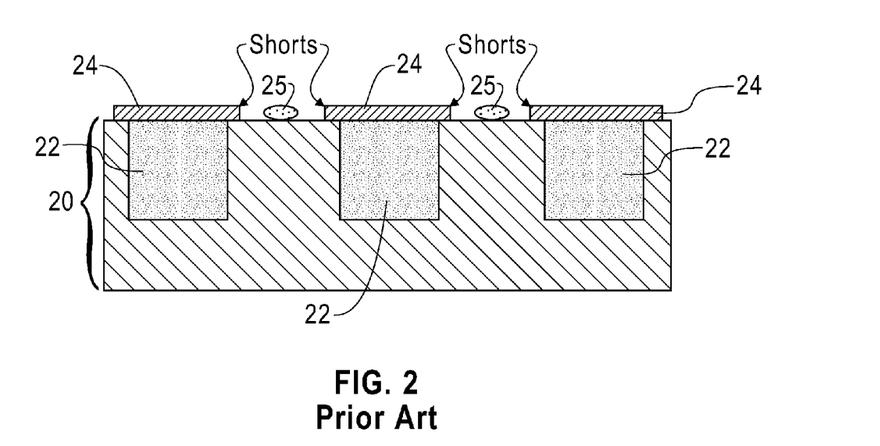
FIG. 2 is a prior art interconnect structure (through a cross sectional view) including a Co-containing alloy metal cap located atop a conductive material that is embedded within a dielectric material, and metal residues from the Co-containing alloy cap process are present on the dielectric surface.

It has been demonstrated that by replacing the Cu/dielectric interface with a Cu/metal interface can enhance electromigration resistance by greater than 100×. Prior art metal caps are typically comprised of a Co-containing alloy such as, for example, CoWP, which is selectively deposited atop of the Cu conductor region of the interconnect structure. One problem with utilizing such selective deposited metal caps is that some of the metal cap extends onto the adjoining surface of the interconnect dielectric material and, as such, electrical shorts between adjacent interconnects may arise. This is seen, for example, in FIG. 2 wherein reference numeral 20 denotes a dielectric material, reference numeral 22 denotes a conductive material embedded within the dielectric material 20, reference numeral 24 denotes a Co-containing alloy metal cap, and reference numeral 25 denotes metal residues from the Co-containing alloy cap process.

Figure 3:
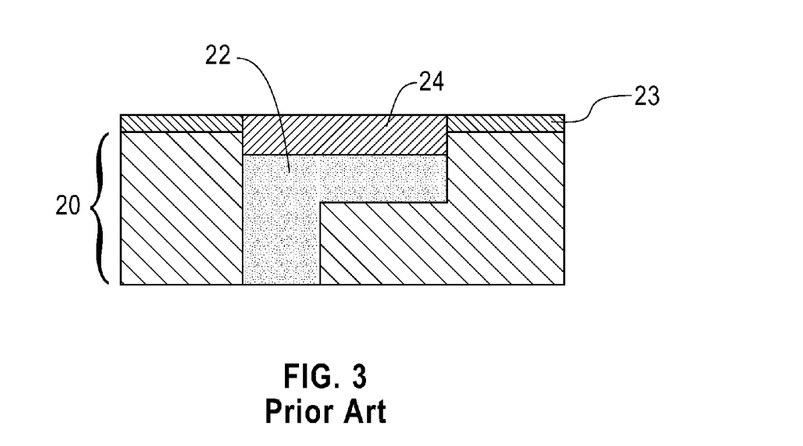
FIG. 3 is a prior interconnect structure (through a cross sectional view) including a recessed conductive material embedded within a dielectric material, said recessed conductive material having a metal capping layer located thereon.

In addition to the above, it is known to provide a metal cap directly on the surface of an interconnect conductive material, such as, for example, Cu, by recessing the interconnect conductive material below a surface of the interconnect dielectric material. Such a structure is shown, for example, in FIG. 3. In this figure, reference numeral 20 denotes the interconnect dielectric material, reference numeral 22 denotes the interconnect conductive material embedded within the dielectric material 20, reference numeral 23 denotes a dielectric cap, and reference numeral 24 denotes the metal cap. Although this prior art recess process provides a metal cap that is located only on a surface of the recessed conductive material, such a process is problematic since there is high process cost associated therewith.

It is also worth mentioning that during a clean in dilute hydrofluoric acid, which is generally used to clean the surface of the interconnect dielectric material, corrosion of metal caps may occur. This is particularly observed when CoWP is used as the metal cap material.

In view of the above, there is a continued need for providing an interconnect structure in which the EM resistance is enhanced without degrading the time dependent dielectric breakdown reliability of the interconnect structure.

SUMMARY OF THE INVENTION

The present invention provides semiconductor interconnect structures that have improved EM reliability. The improved EM reliability is obtained without degrading the time dependent dielectric breakdown reliability of the interconnect structures. The present invention further provides interconnect structures that have better reliability and technology extendibility for the semiconductor industry.

In one embodiment, the present invention provides an interconnect structure in which a discontinuous noble metal-containing cap is present on portions of an exposed upper surface of a non-recessed conductive material which is embedded within a low k dielectric material. The term "discontinuous" when referring to the noble metal-containing cap denotes that the cap exists as nuclei or islands atop some portions of an exposed upper surface of the non-recessed conductive material.

In another embodiment of the present invention, an interconnect structure is provided that includes a non-uniform noble metal-containing cap present on an exposed upper surface of a non-recessed conductive material which is embedded within a low k dielectric material. The term "non-uniform" when referring to the noble metal-containing cap denotes that the cap has a rough source defined by a variable thickness across the exposed upper surface of the embedded conductive material.

In both of the embodiments mentioned above, the noble metal-containing cap of the invention does not extend onto an exposed upper surface of the low k dielectric material. Preferably, the noble metal-containing cap of the invention does not extend onto an upper surface of a diffusion barrier that is used in separating the conductive material from the low k dielectric material. The latter embodiment in which the inventive noble metal-containing cap does not extend onto an upper surface of a diffusion barrier provides a structure that has improved leakage control as compared with prior art interconnect structures.

In general terms, the present invention provides an interconnect structure including:
a dielectric material having a dielectric constant of about 3.0 or less and at least one conductive material embedded therein, the at least one conductive material having an upper surface that is coplanar with an upper surface of the dielectric material; and
a noble metal-containing cap present at least on some portion of the upper surface of the at least one conductive material, wherein said noble metal-containing cap is discontinuous or has a non-uniform thickness.

In the inventive structure, there is no "residues" from the noble metal-containing cap deposited on the dielectric surface. By "residues" it is meant that no fragments of noble metal material form on the dielectric material surface. In some embodiments, the noble metal-containing cap is not present on an upper surface of a diffusion barrier that separates the at least one conductive material from the dielectric material.

The dielectric material which is present in the inventive interconnect structure may be any interconnect dielectric material having a dielectric constant of about 3.0 or less. Illustratively, the dielectric material employed in the present invention comprises a silsesquioxane, a C doped oxide (i.e., an organosilicate) that includes at least atoms of Si, C, O and H, a thermosetting polyarylene ether, or multilayers thereof. The dielectric material may be porous, non-porous or contain regions and/or surfaces that are porous and other regions and/or surfaces that are non-porous.

The conductive material which forms an embedded conductive region within the interconnect structure includes any material that has the ability to transfer electricity. Examples of conductive material that can be present in the conductive region include, for example, polySi, a conductive metal, a conductive metal alloy, a conductive metal silicide or combinations and multilayers thereof. In one embodiment of the present invention, the conductive material includes a conductive metal such as, for example, Cu, W, and/or Al. In a highly preferred embodiment of the present invention, the conductive material includes a Cu-containing conductive material such as, for example, Cu, or a Cu alloy (such as AlCu).

As mentioned above, the conductive material is separated from the dielectric material by a diffusion barrier. The diffusion barrier prevents diffusion of the conductive material into the dielectric material. Examples of diffusion barriers that can be present within the conductive region include, for example, Ta, TaN, Ti, TiN, Ru, RuN, RuTa, RuTaN, IrTa, IrTaN, W, WN or combinations and multilayers thereof.

The conductive material may be present within a via opening, a line opening, a combined via and line opening or any combination thereof.

The term "noble metal-containing" when referring to the cap located directly atop the at least one conductive material includes any metal that is resistant to corrosion or oxidation. The preferred noble metals that can be used in the present invention are selected from the group consisting of Ru, Ir, Rh, Pt, Co, W and alloys thereof. More preferably, the noble metal employed as the noble metal-containing cap comprises Ru or a Ru alloy.

In addition to the interconnect structure mentioned above, the present invention also provides a method of fabricating the same. In general terms, the inventive method includes:
providing a dielectric material having a dielectric constant of about 3.0 or less and at least one conductive material embedded therein, the at least one conductive material has an upper surface that is coplanar with an upper surface of the dielectric material; and
forming a noble metal-containing cap directly on the upper surface of the at least one conductive material, wherein the noble metal cap is discontinuous or non-uniform.

DETAILED DESCRIPTION OF THE INVENTION

The present invention, which provides interconnect structures having enhanced electromigration (EM) resistance without degrading time dependent dielectric breakdown reliability and a method of forming the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention provides an interconnect structure (See, for example, FIG. 4E and FIG. 5) including a dielectric material having a dielectric constant of about 3.0 or less and having at least one conductive material embedded therein. The at least one conductive material has an upper surface that is coplanar with an upper surface of the dielectric material. The inventive interconnect structure also includes a noble metal-containing cap that is present at least on some portion of the upper surface of the at least one conductive material. In one embodiment, the noble metal-containing cap is discontinuous, e.g., exists as nuclei or islands on the surface of the at least one conductive material. In another embodiment, the noble metal-containing cap has a non-uniform thickness across the surface of the at least one conductive material.

In the inventive structure, there is no "residues" from the noble metal-containing cap deposited on the dielectric surface. By "residues" it is meant that no fragments of noble metal material form on the dielectric material surface. In some embodiments, the noble metal-containing cap is not present on an upper surface of a diffusion barrier that separates the at least one conductive material from the dielectric material.

The present invention also provides a method of fabricating an interconnect structure which includes a discontinuous/non-uniform noble metal-containing cap. In general terms, the inventive method, which is illustrated, for example, in FIGS. 4A-4E, includes providing a dielectric material having a dielectric constant of about 3.0 or less and at least one conductive material embedded therein. The at least one conductive material has an upper surface that is coplanar with an upper surface of the dielectric material. Next, a noble metal-containing cap is formed directly on the upper surface of the at least one conductive material. The noble metal-containing cap may be a discontinuous cap or a non-uniform cap that has a rough surface.

Figure 4A:
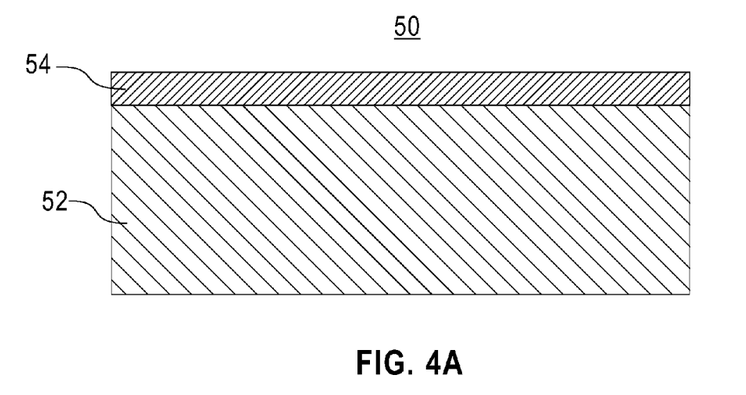
FIGS. 4A-4E are pictorial representations (through cross-sectional views) illustrating an interconnect structure that can be formed in the present invention containing a discontinuous noble metal-containing cap atop a conductive material embedded within a dielectric material. It is noted that FIGS. 4B-4E are cross-sectional views that are parallel to the opening formed into the dielectric material.

Specifically, FIG. 4A illustrates an initial structure 50 that can be employed in the present invention in fabricating the inventive interconnect structure. The initial structure 50 includes a dielectric material 52 having a pad stack 54 located on an upper surface thereof.

It is noted that the initial structure 50 is typically located upon a substrate (not shown in the drawings of the present application). The substrate may comprise a semiconducting material, an insulating material, a conductive material or any combination including multilayers thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

When the substrate comprises a combination of an insulating material and a conductive material, the substrate may represent a first interconnect level of a multilayered interconnect structure.

The dielectric material 52 of the initial structure 50 comprises any interlevel or intralevel dielectric including inorganic dielectrics or organic dielectrics. The dielectric material 52 may be porous, non-porous or contain regions and/or surfaces that are porous and other regions and/or surfaces that may be non-porous. Some examples of suitable dielectrics that can be used as the dielectric material 52 include, but are not limited to silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material 52 typically has a dielectric constant that is about 3.0 or less, with a dielectric constant of about 2.8 or less being even more typical. All dielectric constants mentioned herein are relative to a vacuum, unless otherwise noted. These dielectrics generally have a lower parasitic cross talk as compared with dielectric materials that have a higher dielectric constant than 4.0. The thickness of the dielectric material 52 may vary depending upon the dielectric material used as well as the exact number of dielectric layers within the dielectric material 52. Typically, and for normal interconnect structures, the dielectric material 52 has a thickness from 50 nm to 1000 nm.

The dielectric material 52 is formed utilizing any conventional deposition process including, but not limited to chemical vapor deposition (CVD), plasma enhanced chemical vapor deposition (PECVD), evaporation, chemical solution deposition and spin-on coating.

After forming the dielectric material 52, pad stack 54 is formed on an exposed upper surface of dielectric material 52. The pad stack 54 comprises an oxide, nitride, oxynitride or multilayers thereof (e.g., a pad stack comprising a pad oxide and a pad nitride). The pad stack 54 typically comprises a semiconductor oxide, semiconductor nitride and/or a semiconductor oxynitride. Preferably, the pad stack 54 comprises an oxide of silicon and/or a nitride of silicon.

In some embodiments, the pad stack 54 may be formed utilizing any conventional deposition process including, for example, CVD, PECVD, evaporation, chemical solution deposition, physical vapor deposition (PVD) and atomic layer deposition (ALD). In other embodiments, the pad stack 54 is formed by a thermal process such as, for example, a thermal oxidation, a thermal nitridation and/or a thermal oxynitridation process. In yet other embodiments, the pad stack 54 is formed utilizing a combination of deposition and thermal processes.

The thickness of the pad stack 54 may vary depending on the number of materials within the pad stack itself as well as the technique that was used in forming the same. Typically, the pad stack 54 has a thickness from 10 nm to 80 nm.

After forming the initial structure 50 shown in FIG. 4A, at least one opening 56 is formed into the dielectric material 52 utilizing the pad stack 54 as a pattern mask. The resultant structure including the at least one opening 56 is shown, for example, in FIG. 4B. The at least one opening 56 may include a via opening, a line opening, a combined via and line opening, or any combination thereof. In the drawings, a line opening is shown by way of a non-limiting example.

Figure 4B:
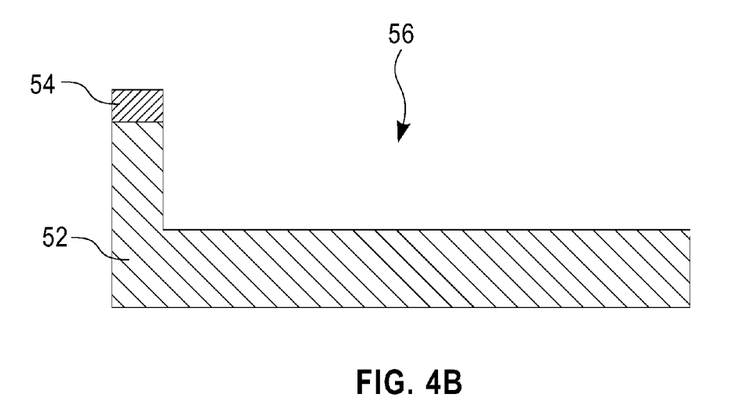

The at least one opening 56 is formed utilizing conventional lithography and etching. The lithographic step includes forming a photoresist (organic, inorganic or hybrid) atop the pad stack 54 utilizing a conventional deposition process such as, for example, CVD, PECVD and spin-on coating. Following formation of the photoresist, the photoresist is exposed to a desired pattern of radiation. Next, the exposed photoresist is developed utilizing a conventional resist development process.

After the development step, an etching step is performed to transfer the pattern from the patterned photoresist into first the pad stack 54 and then the dielectric material 52. The patterned photoresist is typically removed from the surface of the structure after transferring the pattern into the pad stack 54 utilizing a conventional resist stripping process such as, for example, ashing. The etching step used in forming the at least one opening 56 comprises a dry etching process (including reactive ion etching, ion beam etching, plasma etching or laser ablation), a wet chemical etching process or any combination thereof. Typically, reactive ion etching is used to form the at least one opening 56.

Figure 4C:
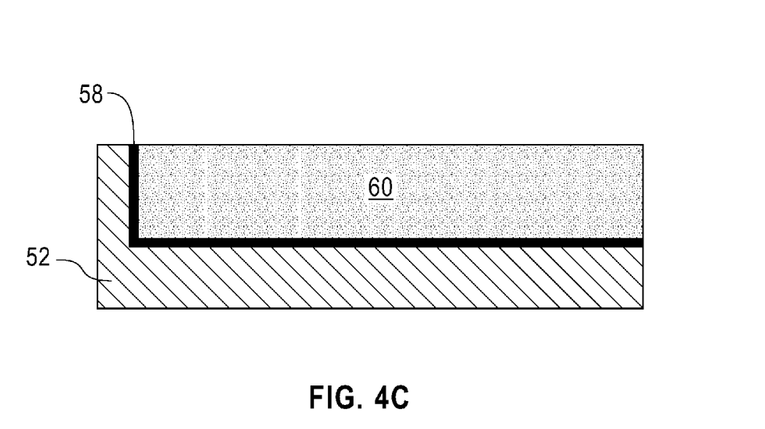

Next, and as shown in FIG. 4C, a diffusion barrier 58 and a conductive material 60 are formed into each of the at least one openings 56. The diffusion barrier 58 comprises Ta, TaN, Ti, TiN, Ru, RuN, RuTa, RuTaN, IrTa, IrTaN, W, WN or any other material that can serve as a barrier to prevent conductive material from diffusing there through. The thickness of the diffusion barrier 58 may vary depending on the deposition process used as well as the material employed. Typically, the diffusion barrier 58 has a thickness from 4 nm to 40 nm, with a thickness from 7 nm to 20 nm being more typical.

The diffusion barrier 58, which is located between the conductive material 60 and the dielectric material 52 is formed by any conventional deposition process including, for example, CVD, PECVD, PVD, sputtering and plating.

The conductive material 60 used in forming the conductive region of the interconnect structure includes, for example, polySi, a conductive metal, an alloy comprising at least one conductive metal, a conductive metal silicide or combinations thereof. Preferably, the conductive material 60 that is used in forming the conductive region is a conductive metal such as Cu, W or Al, with Cu or a Cu alloy (such as AlCu) being highly preferred in the present invention.

The conductive material 60 is formed into each of the openings 56 that are lined with the diffusion barrier 58 utilizing any conventional deposition process including, for example, CVD, PECVD, PVD, sputtering, plating, chemical solution deposition and electroless plating. After deposition of the conductive material 60, the structure is subjected to a planarization process such as, for example, chemical mechanical polishing (CMP) and/or grinding. The planarization process provides a planar structure such as is shown in FIG. 4C in which the upper surfaces of the dielectric material 52, the diffusion barrier 58 (which is now U-shaped) and the conductive material 60 are substantially coplanar with each other. It is noted that during the planarization process, the remaining pad stack 54 is removed from the structure.

Figure 4D:
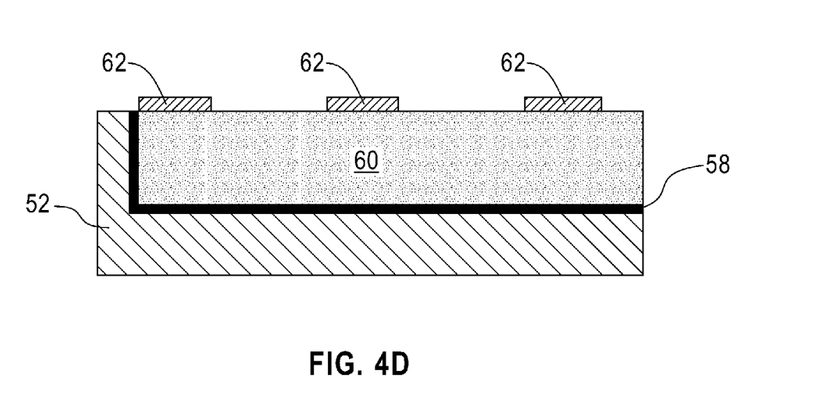

Next, and as is shown in FIG. 4D, a discontinuous noble metal-containing cap 62 is selectively formed essentially atop the conductive material 60. The term "noble metal-containing" when referring to the discontinuous noble metal cap 62 located essentially atop the at least one conductive region (i.e., conductive material 60) includes any metal that is resistant to corrosion or oxidation. The term "essentially" when referring to the discontinuous noble metal-containing cap 62 is used herein to denote that no portion of the cap extends onto the surface of the dielectric material. Preferably, no portion of the cap 62 extends onto the diffusion barrier.

The preferred noble metals that can be used in the present invention as the discontinuous noble metal-containing cap 62 are selected from the group consisting of Ru, Ir, Rh, Pt, Co, W and alloys thereof. The term "alloy" is used to denote a mixture of noble metals as well as elements such as W, B and P. More preferably, the noble metal employed as the discontinuous noble metal-containing cap 62 comprises Ru or a Ru alloy. In some embodiments, the discontinuous noble metal-containing cap 62 includes a multilayered noble metal or noble metal alloy stack.

The thickness of the discontinuous noble metal-containing cap 62 may vary depending on the type of noble metal present in the cap, the deposition technique and conditions used as well as the number of noble metals within the cap. Typically, the discontinuous noble metal-containing cap 62 has a thickness from 1 Å to 100 Å, with a thickness from 5 Å to 50 Å being more highly preferred.

In some embodiments of the present invention, the discontinuous metal-containing cap 62 is formed by a chemical deposition process including, for example, CVD, PECVD and ALD. When a chemical deposition process is used in forming the discontinuous noble metal-containing cap 62, the discontinuity within the cap is achieved by controlling at least one of the deposition time, the deposition pressure and the deposition temperature.

Specifically, the applicants have determined that a discontinuous noble metal-containing cap, as described above, can be obtained by performing the chemical deposition using at least one of the following deposition parameters: A deposition time of less than 3 minutes, preferably from 0.1 minutes to 2 minutes, and more preferably from 0.5 minutes to 1 minute. A deposition pressure of 50 mTorr or less, preferably 20 mTorr or less, and more preferably from 5 mTorr to 20 mTorr. A deposition temperature of 300° C. or less, preferably 200° C. or less, and more preferably from 150° C. to 200° C. In a highly preferred embodiment of the invention, a discontinuous noble metal-containing cap 62 can be obtained by chemical deposition at a temperature from 150° C. to 200° C. and a pressure from 5 mTorr to 20 mTorr for a duration of less than 1 minute.

In addition to chemical deposition, a discontinuous noble metal-containing cap 62 can be formed by utilizing electroless plating or by electroplating. Electroplating is a process of using electrical current to reduce cations of a desired material, e.g., a noble metal, from a solution and coat a conductive object, e.g., the at least one conductive material, with a thin layer of the material, e.g., the noble metal. In electroless plating, a redox reaction involving the oxidation of one or more soluble reducing agents such as, for example, hypophosphite, and the reduction of one or metallic ions, e.g., noble metal ions, occurs on the surface of a substrate, e.g., the at least one conductive material.

When plating techniques are used in forming a discontinuous cap, the discontinuity within the cap is achieved by performing the plating process for a duration of time of less than 3 minutes, preferably from 0.1 minutes to 2 minutes, and more preferably from 0.5 minutes to 1 minute. The plating temperature and pressure are not relative for this embodiment for controlling the discontinuity of the cap 62.

In addition to the above techniques that have been described, the discontinuous noble metal-containing cap 62 can be formed by first forming a continuous noble metal-containing cap across the entire surface of the at least one conductive material; some of the noble metal cap may extend onto an upper surface of the diffusion barrier, but not onto the dielectric material. Such deposition is achieved utilizing a low temperature chemical deposition process including, for example, CVD, PECVD, low pressure CVD and ALD. By "low temperature", it is meant a deposition temperature of about 200° C. or less, with a deposition temperature of less than about 150° C. being even more preferred. The deposition conditions are selected to provide a deposition rate of the continuous noble metal-containing cap onto the conductive material 60 that is from 0.2 to 1.2 Å/sec.

After forming the continuous noble metal-containing cap, portions of the continuous noble metal-containing cap are selectively removed so as to form a discontinuous noble metal-containing cap, as described above. The selective removal may be performed by first forming a patterned mask or block mask over portions of the structure, including portions of the continuous noble metal-containing cap. Next, a selective etching process including, for example, a dry etch or a wet chemical etch can be used. When dry etching is used, one of reactive ion etching, ion beam etching, plasma etching and laser ablation can be used. When a wet chemical etch is employed, a mixture of HCl, $H_2SO_4$, HF and $HNO_3$ can be used as a chemical etchant. In yet another embodiment, the selective removal can be achieved using a touch-up chemical mechanical polishing (CMP) process. By "touch-up CMP" it is meant a short, less than 1 minute, and non-uniform CMP process.

After selectively forming the discontinuous noble metal-containing cap 62 predominately onto conductive material 60, a dielectric capping layer 64 is formed across the entire structure shown in FIG. 4D. The resultant structure including the dielectric capping layer 64 is shown, for example, in FIG. 4E. The dielectric capping layer 64 comprises any suitable dielectric capping material such as, for example, SiC, $Si_4NH_3$, $SiO_2$, a carbon doped oxide, a nitrogen and hydrogen doped silicon carbide SiC(N,H) or multilayers thereof.

Figure 4E:
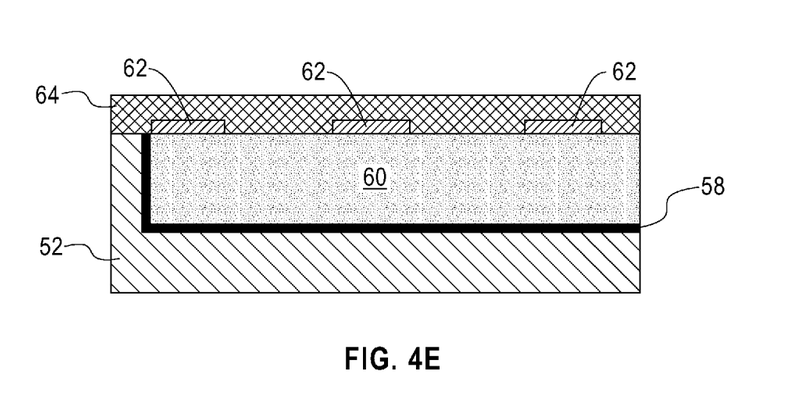

The thickness of the dielectric capping layer 64 may vary depending on the technique used to form the same as well as the material make-up of the layer. Typically, the dielectric capping layer 64 has a thickness from 15 nm to 100 nm, with a thickness from 25 nm to 45 nm being more typical.

The dielectric capping layer 64 is formed utilizing any conventional deposition process including, for example, CVD, PECVD, evaporation, spin-on coating and chemical solution deposition.

FIG. 4E illustrates an interconnect structure in accordance with an embodiment of the present invention. Specifically, this inventive interconnect structure includes a dielectric material 52 having a dielectric constant of about 3.0 or less. The dielectric material 52 has at least one conductive region (represented by conductive material 60) embedded within the dielectric material 52, said at least one conductive region having an upper surface. A discontinuous noble metal cap 62 is located directly on the upper surface of the at least one conductive region (i.e., conductive material 60).

Figure 5:
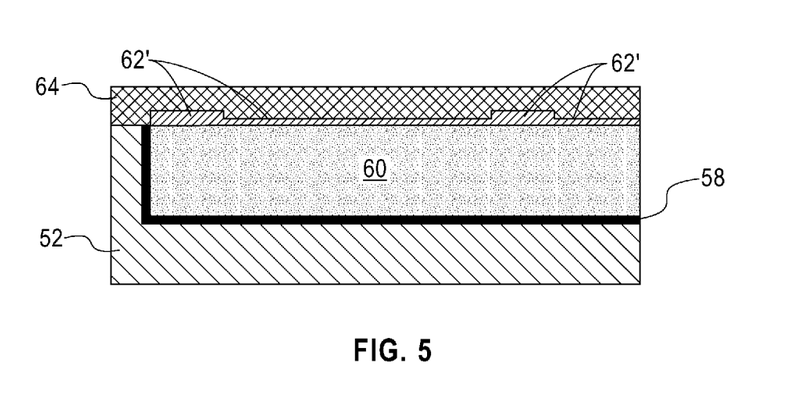
FIG. 5 is a pictorial representation (through a cross-sectional view that is parallel to the opening formed into the dielectric material) illustrating an alternative interconnect structure that can be formed in the present invention containing a non-uniform noble metal-containing cap atop a conductive material embedded within a dielectric material.

FIG. 5 illustrates an alternative interconnect structure that can be employed in the present invention. The alternative interconnect structure of FIG. 5 is essentially the same as the interconnect structure shown in FIG. 4E, except that the discontinuous noble metal-containing cap 62 is replaced with a noble metal cap that has a rough surface that is characterized as having a variable thickness across the entire surface of the at least one conductive material. In the alternative interconnect structure, reference numeral 62' is used to denote the 'non-uniform' noble metal-containing cap. The non-uniform noble metal-containing cap 62' is formed utilizing basically the same chemical deposition techniques and materials as described above. One difference between the above described chemical depositions techniques that ensures a non-uniform noble metal-containing cap 62' is that longer processing times are used. For example, a non-uniform noble metal-containing cap 62' can be formed using a desposition time of less than 5 minutes, preferably from 0.5 to 3 minutes, and more preferably from 1 minute to 2 minutes.

Notwithstanding whether a discontinuous or non-uniform noble metal-containing cap is formed, the applicants have determined that the presence of either the discontinuous noble metal-containing cap or the non-uniform noble metal-containing cap atop a conductive material embedded within an interconnect dielectric improves the EM resistance of the interconnect structure. In prior art interconnect structures, a continuous noble metal-containing cap is used and was thought to be the desired cap design for EM improvement. In addition to improved EM, the applicants have determined that the presence of either the discontinuous noble metal-containing cap or the non-uniform noble metal-containing cap atop a conductive material embedded within an interconnect dielectric also improves the time dependent dielectric breakdown (TDDB) reliability of the interconnect structure. Such an improved in TDDB reliability is not observed when a continuous noble metal-containing cap is employed.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising:
   a dielectric material having a dielectric constant of about 3.0 or less and at least one conductive material embedded therein, the at least one conductive material having an upper surface that is coplanar with an upper surface of the dielectric material; and
   a noble metal-containing cap present on an entirety of the upper surface of the at least one conductive material, said noble metal-containing cap having a non-uniform thickness and does not extend beyond outer edges of the at least one conductor material onto said upper surface of said dielectric material and an upper surface of a diffusion barrier that is positioned between said conductive material and said dielectric material.

2. The interconnect structure of claim 1 wherein said noble metal-containing cap is selected from the group consisting of Ru, Ir, Rh, Pt, Co, W and alloys thereof.

3. The interconnect structure of claim 2 wherein said noble metal-containing cap comprises Ru or a Ru alloy.

4. The interconnect structure of claim 1 further comprising a dielectric capping layer located atop said dielectric material and said noble metal-containing cap.

5. The interconnect structure of claim 4 wherein said dielectric capping layer comprises SiC, $Si_4NH_3$, $SiO_2$, a carbon doped oxide, a nitrogen and hydrogen doped silicon carbide SiC(N,H) or multilayers thereof.

6. The interconnect structure of claim 1 wherein said at least one conductive material comprises polySi, a conductive metal, a conductive metal alloy, a conductive metal silicide or combinations and multilayers thereof.

7. The interconnect structure of claim 6 wherein said at least one conductive material is a conductive metal selected from one of Cu, W and Al.

8. The interconnect structure of claim 1 wherein said dielectric material comprises a silsesquioxane, a C doped oxide that includes at least atoms of Si, C, O and H, a thermosetting polyarylene ether, or multilayers thereof.

9. The interconnect structure of claim 1, wherein said noble metal-containing cap does not contact a portion of the innermost surface of the diffusion barrier.

10. The interconnect structure of claim 1, wherein the bottommost surface of said noble metal-containing cap is coplanar with the uppermost surface of the at least one conductor material, the dielectric material and an upper surface of said diffusion barrier.

11. The interconnect structure of claim 1, wherein said noble metal-containing cap does not contact a portion of the innermost surface of said dielectric material portion.

12. The interconnect structure of claim 1, wherein the bottommost surface of said noble metal-containing cap is coplanar with the uppermost surface of the at least one conductor material, the dielectric material and an upper surface of said diffusion barrier.

13. An interconnect structure comprising:
a dielectric material having a dielectric constant of about 3.0 or less and at least one conductive material embedded therein, the at least one conductive material having an upper surface that is coplanar with an upper surface of the dielectric material; and
a noble metal-containing cap present on an entirety of the upper surface of the at least one conductive material, said noble metal-containing cap having a non-uniform thickness and does not extend beyond outer edges of the at least one conductor material onto said upper surface of said dielectric material.

14. The interconnect structure of claim 13, wherein said noble metal-containing cap is selected from the group consisting of Ru, Ir, Rh, Pt, Co, W and alloys thereof.

15. The interconnect structure of claim 13 further comprising a dielectric capping layer located atop said dielectric material and said noble metal-containing cap.

16. The interconnect structure of claim 15, wherein said dielectric capping layer comprises SiC, $Si_4NH_3$, $SiO_2$, a carbon doped oxide, a nitrogen and hydrogen doped silicon carbide SiC(N,H) or multilayers thereof.

17. The interconnect structure of claim 13, wherein said at least one conductive material comprises polySi, a conductive metal, a conductive metal alloy, a conductive metal silicide or combinations and multilayers thereof.

18. The interconnect structure of claim 17 wherein said at least one conductive material is a conductive metal selected from one of Cu, W and Al.

19. The interconnect structure of claim 13 wherein said dielectric material comprises a silsesquioxane, a C doped oxide that includes at least atoms of Si, C, O and H, a thermosetting polyarylene ether, or multilayers thereof.

* * * * *